United States Patent
Lazarev

(10) Patent No.: US 9,589,727 B2
(45) Date of Patent: Mar. 7, 2017

(54) CAPACITOR AND METHOD OF PRODUCTION THEREOF

(71) Applicant: Capacitor Sciences Incorporated, Menlo Park, CA (US)

(72) Inventor: Pavel Ivan Lazarev, Menlo Park, CA (US)

(73) Assignee: CAPACITOR SCIENCES INCORPORATED, Menlo Park, CA (US)

(*) Notice: Subject to any disclaimer, the term of this patent is extended or adjusted under 35 U.S.C. 154(b) by 88 days.

(21) Appl. No.: 14/710,491

(22) Filed: May 12, 2015

(65) Prior Publication Data
US 2016/0020027 A1    Jan. 21, 2016

Related U.S. Application Data

(60) Provisional application No. 61/991,871, filed on May 12, 2014.

(51) Int. Cl.
| H01G 4/14 | (2006.01) |
| H01L 29/00 | (2006.01) |
| H01L 49/02 | (2006.01) |
| H01G 4/008 | (2006.01) |

(52) U.S. Cl.
CPC ............ *H01G 4/14* (2013.01); *H01G 4/008* (2013.01); *H01L 28/40* (2013.01); *H01L 29/00* (2013.01)

(58) Field of Classification Search
CPC  H01G 4/18; H01G 4/018; H01G 4/20; H01G 4/206; H01G 4/232; H01G 9/07; H01G 4/14; H01G 4/221; H01G 4/306
See application file for complete search history.

(56) References Cited

U.S. PATENT DOCUMENTS

| 6,501,093 | B1 | 12/2002 | Marks | |
| 7,033,406 | B2 | 4/2006 | Weir et al. | |
| 7,466,536 | B1 | 12/2008 | Weir et al. | |
| 2008/0283283 | A1 | 11/2008 | Abe et al. | |
| 2009/0184355 | A1 | 7/2009 | Brederlow et al. | |
| 2010/0038629 | A1* | 2/2010 | Lazarev | B82Y 10/00 257/29 |
| 2010/0183919 | A1 | 7/2010 | Holme et al. | |
| 2010/0233491 | A1* | 9/2010 | Nokel | C08G 61/122 428/426 |
| 2010/0255381 | A1 | 10/2010 | Holme et al. | |
| 2012/0008251 | A1 | 1/2012 | Yu et al. | |

(Continued)

FOREIGN PATENT DOCUMENTS

WO    WO 2007/078916 A2    7/2007

OTHER PUBLICATIONS

Hardy, et al. Converting an Electrical Insulator into a Dielectric Capacitor: End-Capping Polystyrene with Oligoaniline. DOI: 10.1021/cm304057f. Chem. Mater., 2013, 25 (5), pp. 799-807.

(Continued)

*Primary Examiner* — Dion R Ferguson
(74) *Attorney, Agent, or Firm* — Joshua D. Isenberg; JDI Patent

(57) ABSTRACT

The present invention relates generally to the fields of electrical engineering and electronics. More specifically, the present invention relates to passive components of electrical circuit and more particularly to a capacitor intended for energy storage and method of production thereof.

16 Claims, 5 Drawing Sheets

(56) References Cited

U.S. PATENT DOCUMENTS

| | | |
|---|---|---|
| 2013/0056720 A1 | 3/2013 | Kim et al. |
| 2013/0194716 A1 | 8/2013 | Holme et al. |
| 2014/0035100 A1 | 2/2014 | Cho |
| 2014/0036410 A1 | 2/2014 | Okamatsu et al. |

OTHER PUBLICATIONS

Ho, et al. High dielectric constant polyaniline/poly(acrylic acid) composites prepared by in situ polymerization. Synthetic Metals 158 (2008) 630-637.

Solar PV Power Cheaper than Natural Gas. Energy Materials Corporation. PowerPoint. Aug. 10, 2010.

Wang, et al. Morphological and dimensional control via hierarchical assembly of doped oligoaniline single crystals. J Am Chem Soc. Jun. 6, 2012;134(22):9251-62. doi: 10.1021/ja301061a. Epub May 25, 2012.

International search report and written opinion dated Jul. 28, 2015 for PCT Application No. US2015/030356.

\* cited by examiner

CAPACITOR AND METHOD OF PRODUCTION THEREOF

CROSS-REFERENCE

This application claims the benefit of U.S. Provisional Application No. 61/991,871, filed May 12, 2014, which is entirely incorporated herein by reference.

FIELD OF THE INVENTION

The present invention relates generally to passive components of electrical circuit and more particularly to a capacitor intended for energy storage and method of production thereof.

BACKGROUND OF THE INVENTION

A capacitor is a passive electronic component that is used to store energy in the form of an electrostatic field, and comprises a pair of electrodes separated by a dielectric layer. When a potential difference exists between two electrodes, an electric field is present in the dielectric layer. This field stores energy, and an ideal capacitor is characterized by a single constant value of capacitance which is a ratio of the electric charge on each electrode to the potential difference between them. In practice, the dielectric layer between electrodes passes a small amount of leakage current. Electrodes and leads introduce an equivalent series resistance, and dielectric layer has limitation to an electric field strength which results in a breakdown voltage. The simplest energy storage device consists of two parallel electrodes separated by a dielectric layer of permittivity &, each of the electrodes has an area S and is placed on a distance d from each other. Electrodes are considered to extend uniformly over an area S, and a surface charge density can be expressed by the equation: $\pm\rho=\pm Q/S$. As the width of the electrodes is much greater than the separation (distance) d, an electrical field near the centre of the capacitor will be uniform with the magnitude $E=\rho/\varepsilon$. Voltage is defined as a line integral of the electric field between electrodes. An ideal capacitor is characterized by a constant capacitance C defined by the formula $$C=Q/V, \quad (1)$$

which shows that capacitance increases with area and decreases with distance. Therefore the capacitance is largest in devices made of materials of high permittivity.

A characteristic electric field known as the breakdown strength $E_{bd}$, is an electric field in which the dielectric layer in a capacitor becomes conductive. Voltage at which this occurs is called the breakdown voltage of the device, and is given by the product of dielectric strength and separation between the electrodes $$V_{bd}=E_{bd}d. \quad (2)$$

The maximal volumetric energy density stored in the capacitor is limited by the value proportional to $\sim \in \cdot E^2_{bd}$, where $\in$ is dielectric permittivity and $E_{bd}$ is breakdown strength. Thus, in order to increase the stored energy of the capacitor it is necessary to increase dielectric permeability $\in$ and breakdown strength $E_{bd}$ of the dielectric.

For high voltage applications much larger capacitors have to be used. There is a number of factors that can dramatically reduce the breakdown voltage. Geometry of the conductive electrodes is important for these applications. In particular, sharp edges or points hugely increase the electric field strength locally and can lead to a local breakdown. Once a local breakdown starts at any point, the breakdown will quickly "trace" through the dielectric layer till it reaches the opposite electrode and causes a short circuit.

Breakdown of the dielectric layer usually occurs as follows. Intensity of an electric field becomes high enough to free electrons from atoms of the dielectric material and make them conduct an electric current from one electrode to another. Presence of impurities in the dielectric or imperfections of the crystal structure can result in an avalanche breakdown as observed in semiconductor devices.

Other important characteristic of a dielectric material is its dielectric permittivity. Different types of dielectric materials are used for capacitors and include ceramics, polymer film, paper, and electrolytic capacitors of different kinds. The most widely used polymer film materials are polypropylene and polyester. Increase of dielectric permittivity allows increasing of volumetric energy density which makes it an important technical task.

An ultra-high dielectric constant composite of polyaniline, PANI-DBSA/PAA, was synthesized using in situ polymerization of aniline in an aqueous dispersion of polyacrylic acid (PAA) in the presence of dodecylbenzene sulfonate (DBSA) (see, Chao-Hsien Hoa et al., "High dielectric constant polyaniline/poly(acrylic acid) composites prepared by in situ polymerization", Synthetic Metals 158 (2008), pp. 630-637). The water-soluble PAA served as a polymeric stabilizer, protecting the PANI particles from macroscopic aggregation. A very high dielectric constant of ca. $2.0*10^5$ (at 1 kHz) was obtained for the composite containing 30% PANI by weight. Influence of the PANI content on the morphological, dielectric and electrical properties of the composites was investigated. Frequency dependence of dielectric permittivity, dielectric loss, loss tangent and electric modulus were analyzed in the frequency range from 0.5 kHz to 10 MHz. SEM micrograph revealed that composites with high PANI content (i.e., 20 wt. %) consisted of numerous nano-scale PANI particles that were evenly distributed within the PAA matrix. High dielectric constants were attributed to the sum of the small capacitors of the PANI particles. The drawback of this material is a possible occurrence of percolation and formation of at least one continuous conductive path under electric field with probability of such an event increasing with an increase of the electric field. When at least one continuous path (track) through the neighboring conducting PANI particles is formed between electrodes of the capacitor, it decreases a breakdown voltage of such a capacitor.

Single crystals of doped aniline oligomers are produced via a simple solution-based self-assembly method (see, Yue Wang, et. al., "Morphological and Dimensional Control via Hierarchical Assembly of Doped Oligoaniline Single Crystals", J. Am. Chem. Soc. 2012, 134, pp. 9251-9262). Detailed mechanistic studies reveal that crystals of different morphologies and dimensions can be produced by a "bottom-up" hierarchical assembly where structures such as one-dimensional (1-D) nanofibers can be aggregated into higher order architectures. A large variety of crystalline nanostructures, including 1-D nanofibers and nanowires, 2-D nanoribbons and nanosheets, 3-D nanoplates, stacked sheets, nanoflowers, porous networks, hollow spheres, and twisted coils, can be obtained by controlling the nucleation of the crystals and the non-covalent interactions between the doped oligomers. These nanoscale crystals exhibit enhanced conductivity compared to their bulk counterparts as well as interesting structure-property relationships such as shape-dependent crystallinity. Furthermore, the morphology and dimension of these structures can be largely rationalized and predicted by monitoring molecule-solvent interactions via absorption studies. Using doped tetra-aniline as a model system, the results and strategies presented in this article provide insight into the general scheme of shape and size control for organic materials.

There is a known energy storage device based on a multilayer structure. The energy storage device includes first and second electrodes, and a multilayer structure comprising blocking and dielectric layers. The first blocking layer is disposed between the first electrode and a dielectric layer, and the second blocking layer is disposed between the second electrode and a dielectric layer. Dielectric constants of the first and second blocking layers are both independently greater than the dielectric constant of the dielectric layer. FIG. 1 shows one exemplary design that includes electrodes 1 and 2, and multilayer structure comprising layers made of dielectric material (3, 4, 5) which are separated by layers of blocking material (6, 7, 8, 9). The blocking layers 6 and 9 are disposed in the neighborhood of the electrodes 1 and 2 accordingly and characterized by higher dielectric constant than dielectric constant of the dielectric material. A drawback of this device is that blocking layers of high dielectric permittivity located directly in contact with electrodes can lead to destruction of the energy storage device. Materials with high dielectric permittivity which are based on composite materials and containing polarized particles (such as PANI particles) might demonstrate a percolation phenomenon. The formed polycrystalline structure of layers has multiple tangling chemical bonds on borders between crystallites. When the used material with high dielectric permittivity possesses polycrystalline structure a percolation might occur along the borders of crystal grains. Another drawback of the known device is an expensive manufacturing procedure which is vacuum deposition of all layers.

Capacitors as energy storage device have well-known advantages versus electrochemical energy storage, e.g. a battery. Compared to batteries, capacitors are able to store energy with very high power density, i.e. charge/recharge rates, have long shelf life with little degradation, and can be charged and discharged (cycled) hundreds of thousands or millions of times. However, capacitors often do not store energy in a small volume or weight as in a case of batteries, or at low energy storage cost, which makes capacitors impractical for some applications, for example electric vehicles. Accordingly, it would be an advance in energy storage technology to provide capacitors of higher volumetric and mass energy storage density and lower cost.

The present invention solves a problem of the further increase of volumetric and mass density of reserved energy of the capacitor, and at the same time reduces cost of materials and manufacturing process.

SUMMARY OF THE INVENTION

Embodiments of the present invention provides a capacitor comprising a first electrode, a second electrode, and a dielectric layer of molecular material disposed between said first and second electrodes. Said electrodes are flat and planar and positioned parallel to each other. The molecular material is described by the general formula

$$D_p\text{-(Core)-}H_q, \quad (I)$$

where Core is a polarizable conductive anisometric core, having conjugated π-systems, and characterized by a longitudinal axis, D and H are insulating substituents, and p and q are numbers of the D and H substituents accordingly. The insulating substituents are attached to the polarizable anisometric core in apex positions, and p and q are independently selected from values 1, 2, 3, 4, and 5.

A method of producing a capacitor, which comprises the steps of a) preparation of a conducting substrate serving as one of the electrodes, b) application of a molecular material on the substrate, c) formation of the solid layer molecular material layer on the substrate, and d) formation of the second electrode on the solid molecular material layer, wherein the molecular material is described by the general formula

$$D_p\text{-(Core)-}H_q. \quad (I)$$

where Core is a conductive and polarizable anisometric core, having conjugated π-systems, and characterized by a longitudinal axis, D and H are insulating substituents, and p and q are numbers of the D and H substituents accordingly. The insulating substituents are attached to the polarizable anisometric core in apex positions, and p and q are independently selected from values 1, 2, 3, 4, and 5.

DETAILED DESCRIPTION OF THE INVENTION

The general description of the present invention having been made, a further understanding can be obtained by reference to the specific preferred embodiments, which are given herein only for the purpose of illustration and are not intended to limit the scope of the appended claims.

Figure 1:
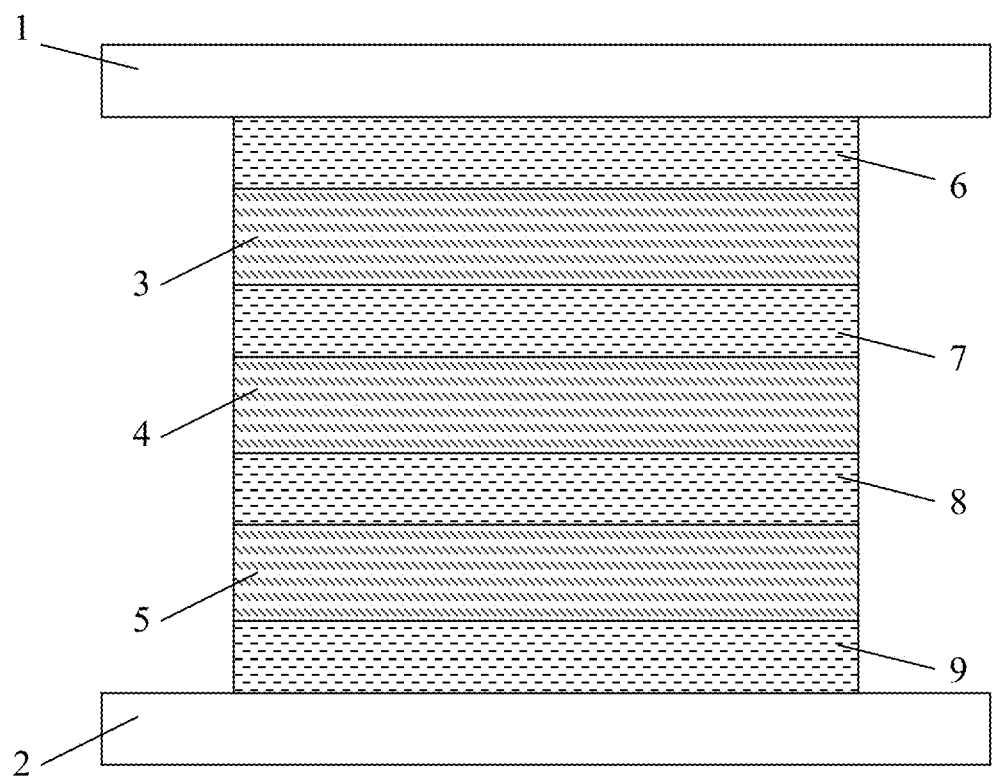
FIG. 1 is a schematic illustration that shows an energy storage device.
Figure 2:
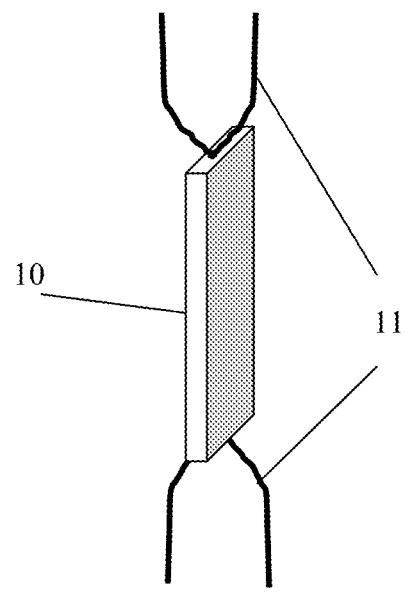
FIG. 2 is a schematic illustration that shows a single molecule of a molecular material, according to an embodiment of the invention.

The present invention provides a capacitor as disclosed hereinabove. The disclosed capacitor comprises a first electrode, a second electrode, and a dielectric layer of molecular material disposed between said first and second electrodes. Said electrodes are flat and planar and positioned parallel to each other. A molecule of the molecular material (schematically shown in FIG. 2) described by general formula

$$D_p\text{-(Core)-}H_q, \quad (I)$$

where Core 10 is a polarizable conductive anisometric core, having conjugated π-systems, and characterized by a longitudinal axis, and insulating substituents D and H 11, and p and q are numbers of substituents D and H accordingly. The insulating substituents are attached to the polarizable anisometric core in apex positions, and p and q are independently selected from values 1, 2, 3, 4, and 5.

The anisometric core is a flat molecular system having thickness not exceeding 0.34±0.01 nm and unequal dimensions. It can be characterized by a longitudinal axis which is an axis along the lengthwise direction of the core.

In one embodiment of the disclosed capacitor at least one of the insulating groups D and at least one of the insulating groups H are independently selected from the list comprising alkyl, fluorinated alkyl, chlorinated alkyl, branched and complex alkyl, branched and complex fluorinated alkyl, branched and complex chlorinated alkyl groups, and any combination thereof.

In one embodiment of the disclosed capacitor the anisometric cores form conductive stacks due to π-π-interaction, and the insulating substituents form the insulating sublayers surrounding said stacks. The longitudinal axes of the adjacent anisometric cores form a twist angle α, said twist angle is in the range of $0° \leq \alpha \leq 90°$, and distance between the cores in the stacks is 0.34±0.1 nm.

Depending on the application of the device, a dielectric permittivity of the insulating sublayer material formed with the insulating substitutes $\in_{ins}$ can be in the broad range; for most embodiments it is in the range between about 2 and 25. The insulating sublayer material is characterized by a band gap of greater than 4 eV. The insulating sublayer is characterized by a breakdown field strength being in the range between about of 0.01 V/nm and 10 V/nm. Due to high polarizability of the anisometric cores, the conductive molecular stacks possess relatively high dielectric permittivity $\in_{cor}$ in comparison with dielectric permittivity of the insulating sublayer $\in_{ins}$. Thus, the conductive polarizable stacks possess dielectric permittivity $\in_{cor}$, which is ten to one hundred thousand times higher than dielectric permittivity $\in_{ins}$ of of the insulating sublayer. Therefore electric field intensity in the insulating sublayer $E_{ins}$ and electric field intensity in the conductive polarizable molecular stacks $E_{cor}$ satisfy $$E_{cor}(\in_{ins}/\in_{cor})\cdot E_{ins}. \quad (1)$$

Electric field intensity $E_{cor}$ is much less than electric field intensity $E_{ins}$ and the voltage enclosed to the energy storage device is distributed over the insulating sublayers. In order to increase a working voltage of the energy storage device it is necessary to increase number of the insulating sublayers.

In one embodiment of the present invention the anisometric cores form twisted conductive stacks, wherein the longitudinal axes (dashed lines in an insert to FIG. 3) of the adjacent anisometric cores are twisted at a twist angle α. In yet another embodiment the dielectric layer has a hexagonal crystal structure.

Figure 3:
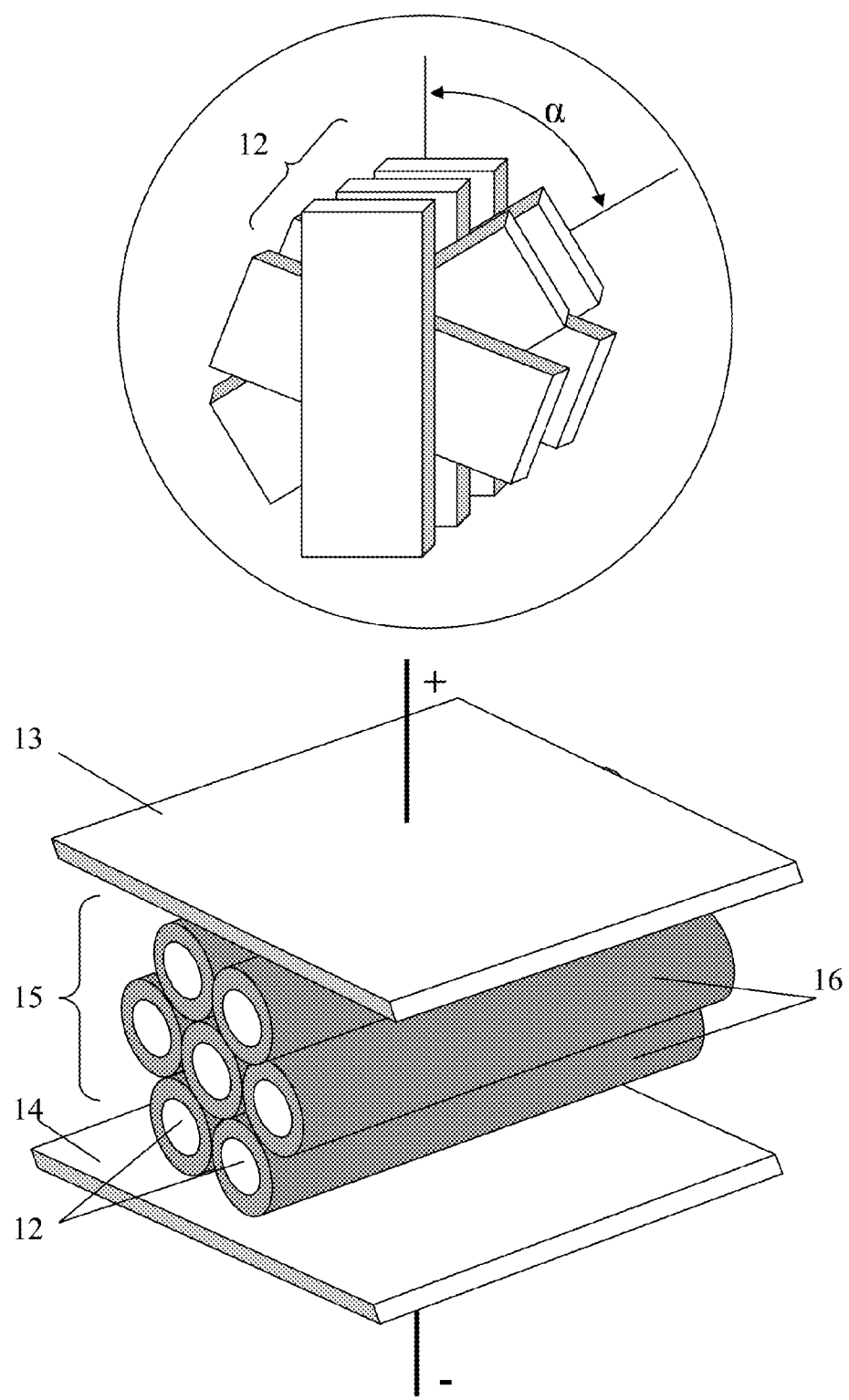
FIG. 3 is a schematic illustration that shows a disclosed capacitor with a hexagonal crystal structure in the dielectric layer of the molecular material, according to an embodiment of the invention. The insert is a schematic illustration that shows a formation of twisted conductive stacks.

In the schematic view in FIG. 3 the capacitor comprises two electrodes 13 and 14 and dielectric layer 15 which comprises the anisotropic twisted stacks 12 surrounded with insulating sublayers 16. The term "hexagonal structure" is referred to the molecular material structure of the dielectric layer comprising the twisted conductive stacks. The dielectric layer is characterized by a dense packing of the twisted stacks located parallel to each other. The projections of these stacks onto a plane normal to them form the two-dimensional structure possessing hexagonal symmetry.

Figure 4:
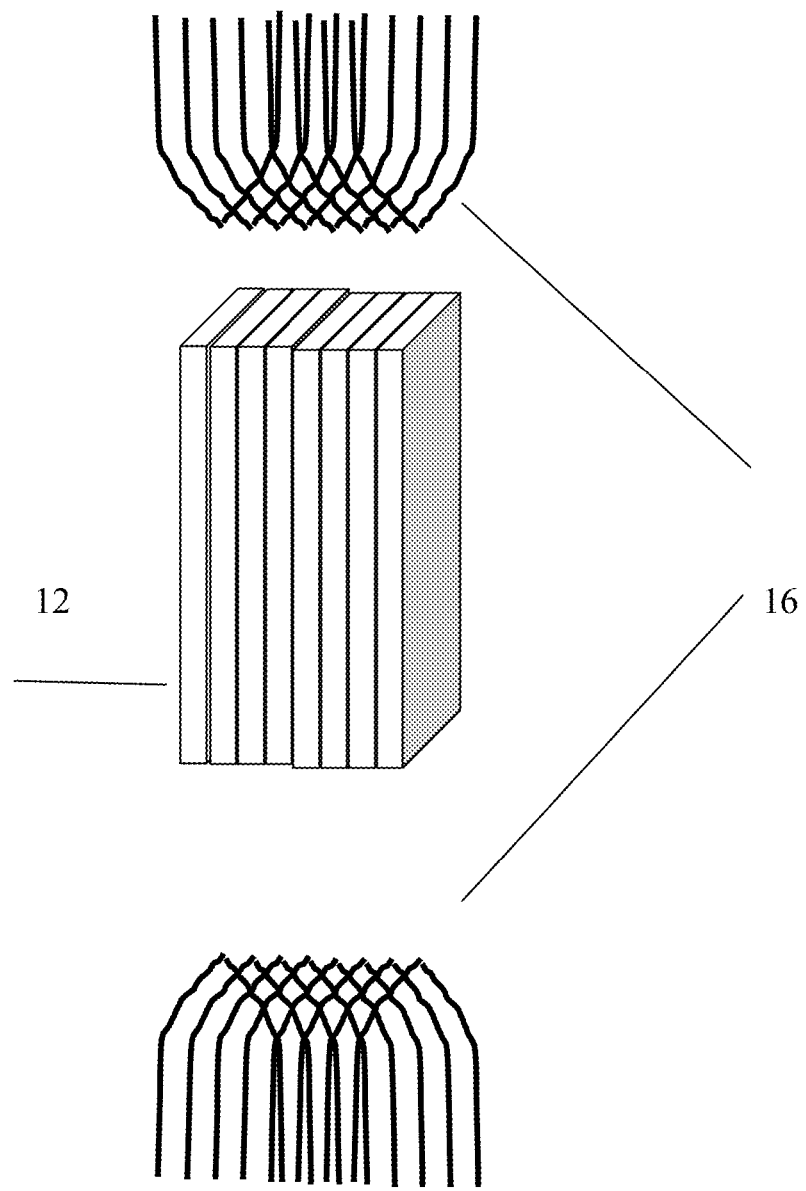
FIG. 4 is a schematic illustration that shows a dielectric layer of the molecular material, wherein the conductive stacks are formed with a twist angle equal to zero, according to an embodiment of the invention.

In one embodiment of the disclosed capacitor the anisometric cores form conductive stacks with the twist angle equal to zero. The longitudinal axes of the anisometric cores in one stack are parallel to each other and perpendicular to the surface of said electrodes. FIG. 4 schematically shows the stack 12 formed with the anisometric cores and the insulating sublayers 16 formed with the insulating substituents. The insulating substituents form the insulating sublayers between the conductive stacks and also between the conductive stacks and electrodes. The additional role of the insulating substitutes is increasing of the work function in the molecular material. Work function is the minimum amount of energy required to remove an electron from the surface of the conductive stack.

Figure 5:
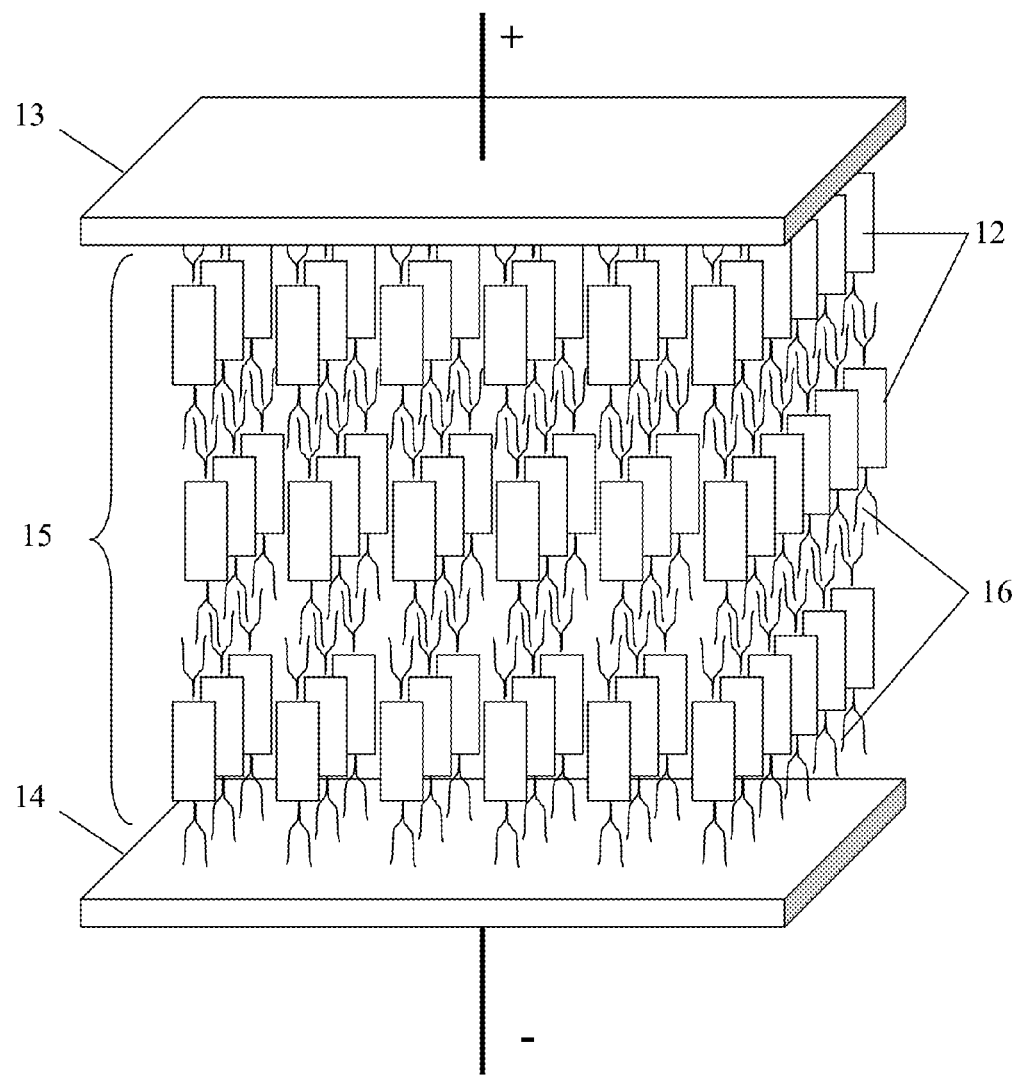
FIG. 5 is a schematic illustration that shows disclosed capacitor with a lamellar structure of the dielectric layer of the molecular material, according to an embodiment of the invention.

In yet another embodiment the molecular material has a lamellar crystal structure. Lamellar structures or microstructures are composed of the alternating fine layers (sublayers) of different materials and/or regions of different structure and/or properties, as for example in a lamellar polyethylene. In the present invention the fine layers of the conductive stacks are alternating with the amorphous sublayers of the insulating substituents. FIG. 5 shows a capacitor with the lamellar structure of the dielectric layer, according to an embodiment of the invention. The capacitor comprises two electrodes 13 and 14, the dielectric layer 15 which comprises the fine layers of the conductive stacks 12 formed with the polarizable anisometric cores, and isotropic insulating sublayers 16.

The polarizable anisometric cores of the molecular material of the disclosed capacitor may possess a translation periodicity and symmetry at least in one direction. The translational symmetry is symmetry type at which properties of considered system do not change at shift on a certain vector which is called a translation vector, and crystals possess a translational symmetry in all three directions.

In one embodiment of the present invention, the polarizable anisometric core is electroconductive oligomer comprising monomers having conjugated π-systems and the electroconductive oligomers form molecular stacks due to π-π-interaction and stacks are positioned parallel to surface of the planar electrode. In one embodiment of the present invention, the electroconductive oligomers are selected from the list comprising following structural formulas corresponding to one of structures 1 to 7 as given in Table 1.

TABLE 1

Examples of the electroconductive oligomers

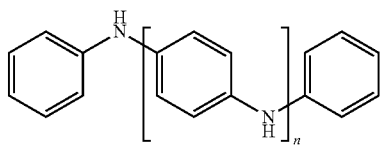

1

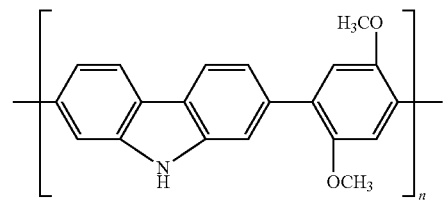

2

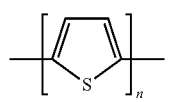

3

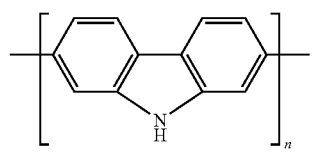

4

TABLE 1-continued

Examples of the electroconductive oligomers

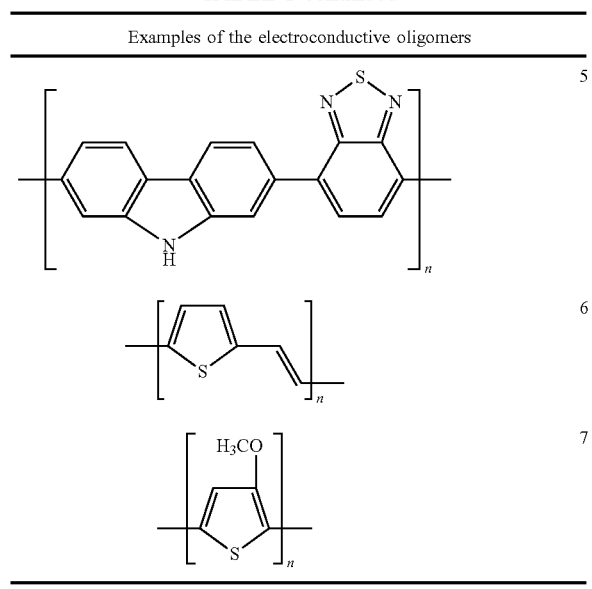

where n equals to 2, 3, 4, 5, 6, 7, 8, 9, 10, 11 or 12.

Electrodes of the disclosed capacitor may be made of any suitable material, including but not limited to Pt, Cu, Al, Ag or Au.

In some embodiments, the capacitor can be produced by a variety of manufacturing methods, which in general comprise the steps of a) preparation of a conducting substrate serving as one of the electrodes, b) application of a molecular material on the substrate, c) formation of the solid layer molecular material layer on the substrate, and d) formation of the second electrode on the solid molecular material layer, wherein the molecular material is described by the general formula $$D_p\text{-(Core)-}H_q. \quad (I)$$

where Core 10 is a polarizable conductive anisometric core, having conjugated π-systems and characterized by a longitudinal axis, D and H are insulating substituents, and p and q are numbers of substituents D and H accordingly. The insulating substituents are attached to the polarizable anisometric core in apex positions, and p and q are independently selected from values 1, 2, 3, 4, and 5.

In one embodiment of the disclosed method at least one of the insulating groups D and at least one of the insulating groups H are independently selected from the list comprising alkyl, fluorinated alkyl, chlorinated alkyl, branched and complex alkyl, branched and complex fluorinated alkyl, branched and complex chlorinated alkyl groups, and any combination thereof.

In one embodiment of the disclosed method the application step b) comprises application of a solution of the molecular material, and the solid layer formation step c) comprises drying to form a solid molecular material layer.

In yet another embodiment of the disclosed method the application step b) comprises application of a melt of the molecular material, and the solid layer formation step c) comprises cooling down to form a solid molecular material layer.

In order that the embodiments of the invention may be more readily understood, reference is made to the following example, which is intended to be illustrative of the invention, but is not intended to be limiting in scope.

Example 1

Example 1 describes a capacitor comprising a dielectric layer formed with the solid molecular material of lamellar structure as shown in FIG. 5.

The capacitor comprises two electrodes 13 and 14, the dielectric layer 15 which comprises the conductive anisometric stacks 12 formed with the polarizable anisometric cores, and isotropic insulating sublayers 16. Polyaniline (PANI) is used as the polarizable anisometric core, and fluorinated alkyl substituents are used as the insulating substituents. The conductive anisometric stacks formed with polyaniline (PANI) have the dielectric permittivity $\epsilon_{cor}$ equal to 10,000. Thickness of each insulating sublayers formed by the substituents is approximately $d_{ins}$=2 nm, and number of the insulating sublayers $n_{ins}$ is equal to 500. Electrodes 13 and 14 are made of copper. Dielectric permittivity of the insulating sublayers is equal to 2.2 (i.e. $\epsilon_{ins}$=2.2) and its breakdown voltage is equal to 1 V/nm. The working voltage of the capacitor does not exceed the breakdown voltage Vbd which is approximately equal to 1000 V.

Although the present invention has been described in detail with reference to a particular preferred embodiment, persons possessing ordinary skill in the art to which this invention pertains will appreciate that various modifications and enhancements may be made without departing from the spirit and scope of the claims that follow.

What is claimed is:

1. A capacitor comprising
a first electrode,
a second electrode, and
a dielectric layer of molecular material disposed between said first and second electrodes,
wherein said electrodes are flat and planar and positioned parallel to each other, and
the molecular material is described by the general formula $$D_p\text{-(Core)-}H_q \quad (I)$$

where Core is a polarizable conductive anisometric core, having conjugated π-systems, and characterized by a longitudinal axis
D and H are insulating substituents, and
p and q are numbers of the D and H substituents accordingly,
wherein said substituents are attached to the polarizable anisometric core in apex positions, and p and q are independently selected from values 1, 2, 3, 4, and 5.

2. A capacitor, according to claim 1, wherein at least one of the insulating groups D and at least one of the insulating groups H is each selected independently from the group consisting of alkyl, fluorinated alkyl, chlorinated alkyl, branched and complex alkyl, branched and complex fluorinated alkyl, branched and complex chlorinated alkyl groups, and any combination thereof.

3. A capacitor according to claim 1, wherein the anisometric cores form conductive stacks due to π-π-interaction, and the insulating substituents form the insulating sublayers surrounding said stacks, wherein a twist angle α is formed between the longitudinal axes of the adjacent anisometric cores, said twist angle is in the range of 0°≤α≤90°, and distance between the cores in the stacks is 0.34±0.1 nm.

4. A capacitor according to claim 3, wherein the anisometric cores form the twisted conductive stacks, wherein said twist angle is in the range of 0°<α≤90°.

5. A capacitor according to claim 4, wherein the dielectric layer of molecular material has a hexagonal crystal structure.

6. A capacitor according to claim 3, wherein the anisometric cores form the conductive stacks, wherein said twist angle α equals zero, and the longitudinal axes of the anisometric cores are perpendicular to the electrodes.

7. A capacitor according to claim 6, wherein the dielectric layer of molecular material has a lamellar crystal structure.

8. A capacitor according to claim 7, wherein said polarizable anisometric cores possess translational periodicity and symmetry at least in one direction.

9. A capacitor according to claim 1, wherein the polarizable anisometric core is an electroconductive oligomer, and said electroconductive oligomers form molecular stacks due to π-π-interaction.

10. A capacitor according to claim 9, wherein said electroconductive oligomer is selected from the group consisting of the following structural formulas 1 to 7:

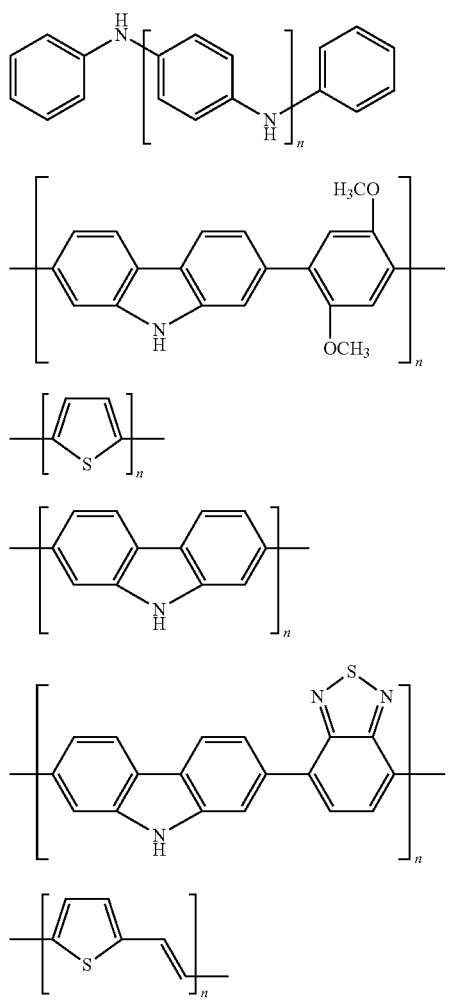

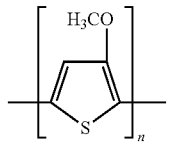

where n=2, 3, 4, 5, 6, 7, 8, 9, 10, 11 or 12.

11. An energy storage device according to claim 1, wherein the electrodes are made of Pt, Cu, Al, Ag or Au.

12. A capacitor according to claim 1, comprising two electrodes made of copper, polyaniline (PANI) as the polarizable anisometric core, and fluorinated alkyl substituents as the insulating substituents.

13. A method of producing a capacitor, which comprises the steps of
   a) preparation of a conducting substrate serving as one of the electrodes,
   b) application of a molecular material on the substrate,
   c) formation of the solid layer of the molecular material, and
   d) formation of the second electrode on the solid molecular material layer,
      wherein the molecular material is described by the general formula $$D_p\text{-(Core)-}H_q \qquad (I)$$

where Core is a polarizable conductive anisometric core, having conjugated π-systems and characterized by a longitudinal axis,
   D and H are insulating substituents, and
   p and q are numbers of the D and H substituents accordingly,
   wherein said substituents are attached to the polarizable anisometric core in apex positions, and p and q are independently selected from values 1, 2, 3, 4, and 5.

14. A method according to claim 13, wherein at least one of the insulating groups D and H are independently selected from the list comprising alkyl, fluorinated alkyl, chlorinated alkyl, branched and complex alkyl, branched and complex fluorinated alkyl, branched and complex chlorinated alkyl groups, and any combination thereof.

15. A method according to claim 13, wherein the application step b) comprises application of a solution of the molecular material, and the solid layer formation step c) comprises drying to form a solid molecular material layer.

16. A method according to claim 13, wherein the application step b) comprises application of a melt of the molecular material, and the solid layer formation step c) comprises cooling down to form a solid molecular material layer.

* * * * *